US00RE43945E

(19) United States
(12) Reissued Patent
Matsunaga et al.

(10) Patent Number: US RE43,945 E
(45) Date of Reissued Patent: Jan. 29, 2013

(54) WIRING LAYOUT OF SEMICONDUCTOR DEVICE AND DESIGN METHOD OF THE SAME

(75) Inventors: Noriaki Matsunaga, Chigasaki (JP); Hitomi Yamaguchi, Yokohama (JP)

(73) Assignee: Kabushiki Kaisha Toshiba, Tokyo (JP)

(21) Appl. No.: 12/180,341

(22) Filed: Jul. 25, 2008

Related U.S. Patent Documents

Reissue of:
(64) Patent No.: 7,135,722
Issued: Nov. 14, 2006
Appl. No.: 10/865,943
Filed: Jun. 14, 2004

(30) Foreign Application Priority Data

Sep. 8, 2003 (JP) ..... 2003-315781

(51) Int. Cl.
*H01L 27/10* (2006.01)

(52) U.S. Cl. ..... 257/211; 257/202; 257/205; 257/274; 257/338; 257/390

(58) Field of Classification Search ..... 257/211, 257/202, 205, 274, 328, 390, 338, 351, 357, 257/369
See application file for complete search history.

(56) References Cited

U.S. PATENT DOCUMENTS

| | | | | |
|---|---|---|---|---|
| 6,184,083 | B1 | 2/2001 | Tsunashima et al. | |
| 6,982,465 | B2 * | 1/2006 | Kumagai et al. | 257/369 |
| 2002/0001861 | A1 * | 1/2002 | Ohuchi | 438/9 |
| 2002/0137281 | A1 | 9/2002 | Watanabe et al. | |
| 2003/0052371 | A1 * | 3/2003 | Matsuzaki et al. | 257/371 |
| 2004/0088658 | A1 | 5/2004 | Minda | |

FOREIGN PATENT DOCUMENTS

| | | |
|---|---|---|
| JP | 11-8224 | 1/1999 |
| JP | 2002-313866 | 10/2002 |

OTHER PUBLICATIONS

Linder, Barry P., et al., "Calculating Plasma Damage as a Function of Gate Oxide Thickness"; 3rd International Symposium on Plasma Process-Induced Damage; Jun. 4-5, 1998; pp. 42-45.

Brozek, Tomasz, et al., "Effect of Device Type and Plasma Process on the Oxide Thickness Dependence of Plasma-Induced Charging Damage"; 3rd International Symposium on Plasma Process-Induced Damage; Jun. 4-5, 1998; pp. 46-49.

(Continued)

*Primary Examiner* — Tan N Tran
(74) *Attorney, Agent, or Firm* — Oblon, Spivak, McClelland, Maier & Neustadt, L.L.P.

(57) ABSTRACT

A semiconductor device is the semiconductor device which includes more than one field effect transistor having a gate electrode to which an electrical interconnect wire is connected and a gate insulation film with a thickness of 6.0 nm or less and which comprises a first transistor group made up of a plurality of field effect transistors that are the same in thickness of gate insulation film, a second transistor group made up of a plurality of field effect transistors that are the same in thickness of gate insulation film with the thickness of gate insulation film being less than the thickness of the gate insulation film of the first transistor group, and a semiconductor substrate on which the first and second transistor groups are mounted together in a mixed manner, wherein an antenna ratio which is a ratio of the area of a wire to the gate area of a gate electrode is such that the maximum value of the second transistor group is greater than the maximum value of the first transistor group.

45 Claims, 15 Drawing Sheets

OTHER PUBLICATIONS

Barry P. Linder, et al. "Calculating Plasma Damage as a Function of Gate Oxide Thickness"; 3rd International Symposium on Plasma Process-Induced Damage; Jun. 4-5, 1998; pp. 42-45.

Thomasz Brozek, et al. "Effect of Device Type and Plasma Process on the Oxide Thickness Dependence of Plasma-Induced Charging Damage"; 3rd International Symposium on Plasma Process-Induced Damage; Jun. 4-5, 1998; pp. 46-49.

* cited by examiner

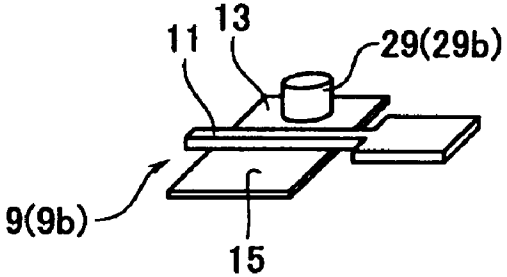
FIG. 14
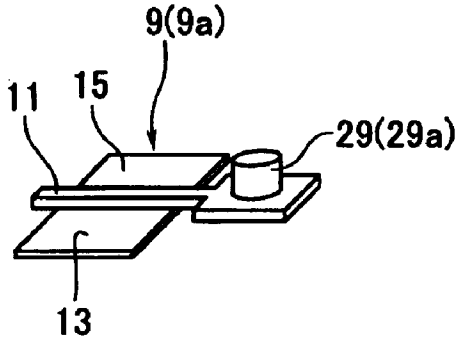

WIRING LAYOUT OF SEMICONDUCTOR DEVICE AND DESIGN METHOD OF THE SAME

Matter enclosed in heavy brackets [ ] appears in the original patent but forms no part of this reissue specification; matter printed in italics indicates the additions made by reissue.

CROSS-REFERENCE TO RELATED APPLICATION

This application is based upon and claims the benefit of priority from the prior Japanese Patent Application No. 2003-315781, filed on Sep. 8, 2003, the entire contents of which are incorporated herein by reference.

BACKGROUND OF THE INVENTION

1. Field of the Invention

The present invention relates to semiconductor devices and design methods thereof and, more particularly, to layout of electrical wiring lines.

2. Description of the Related Art

Semiconductor devices have a structure in which an interlayer dielectric film and a wiring line are stacked or multilayered above a semiconductor substrate in which field effect transistors are formed. Conventionally, a plasma and/or an electron beam is utilized for fabrication of such semiconductor devices. The plasma is utilized, for example, in cleaning processes and in interlayer dielectric film formation processes using plasma CVD. The electron beam is utilized for exposure of a resist which becomes a mask upon patterning of an interlayer dielectric film and/or an electrical conductive film that becomes a wire.

It is inevitable that electrical wires are exposed on or above a semiconductor substrate in the manufacturing process of a semiconductor device. An exposed wire undesirably functions as an antenna for collecting charged particles residing in either a plasma or an electron beam. Since the wire is connected to the gate electrode of a field effect transistor, the charged particles travel through the wire toward the gate electrode, whereby it becomes a problem that a gate insulating film receives damages. This is the so called charge-up damage problem. This damage appears as a change in characteristics of the field effect transistor (such as Vth, Gm, S-factor, Ig or the like).

Here, a ratio of the area of a wire to the gate area of a gate electrode is called the antenna ratio. If the area of the wire is large, that is, if the antenna ratio is significant, then the number of charged particles gathered increases; thus, the gate insulation film becomes more easily affectable by the charge-up damage. Hence, it becomes impossible to unlimitedly enlarge the area (length) of any wire. This means a limitation or constraint relative to the degree of freedom of layout of wires.

When the semiconductor device is designed to employ multilayer wiring technologies, the area (length) of a wire becomes larger, resulting in that the charge-up damage problem becomes more serious. Explaining a plasma as an example, one prior known approach to suppressing the chargeup damage is to improve the performance of semiconductor manufacturing apparatus and/or fabrication processes. More precisely, there are methods for improving the uniformity of a plasma, adjusting the step of an applied voltage, and adjusting a gas or pressure or else (for example, see JP-A-11-8224).

SUMMARY OF THE INVENTION

However, as far as a process which utilizes charged particles (plasma, ions, or electron beam) exists in the manufacture of semiconductor devices, it is unable, by merely improving the performance and fabrication process of semiconductor manufacturing apparatus, to completely eliminate the charge-up damage of gate insulation films.

An object of the present invention is to provide a semiconductor device capable of enhancing the degree of freedom of the layout of electrical interconnect wires while suppressing the charge-up damage and also a design method thereof.

A semiconductor device in accordance with the present invention includes more than one field effect transistor having a gate electrode with a wire connected thereto and a gate insulation film with a thickness less than or equal to 6.0 nm and which comprises a first transistor group made up of a plurality of field effect transistors being the same in thickness of the gate insulation film, a second transistor group which is made up of a plurality of field effect transistors being the same in thickness of the gate insulation film and which is such that the thickness of the gate insulation film is less than the thickness of the gate insulation film of the first transistor group, and a semiconductor substrate with the first and second transistor groups being mounted thereon in a mixed manner, wherein an antenna ratio which is a ratio of an area of said wire to a gate area of the gate electrode is such that a maximal value of the second transistor group is made larger than a maximal value of the first transistor group.

BRIEF DESCRIPTION OF THE DRAWINGS

FIG. 14 is a second step diagram for explanation of formation of the multilayer wire shown in FIG. 12.

DETAILED DESCRIPTION OF THE EMBODIMENTS

Figure 1:
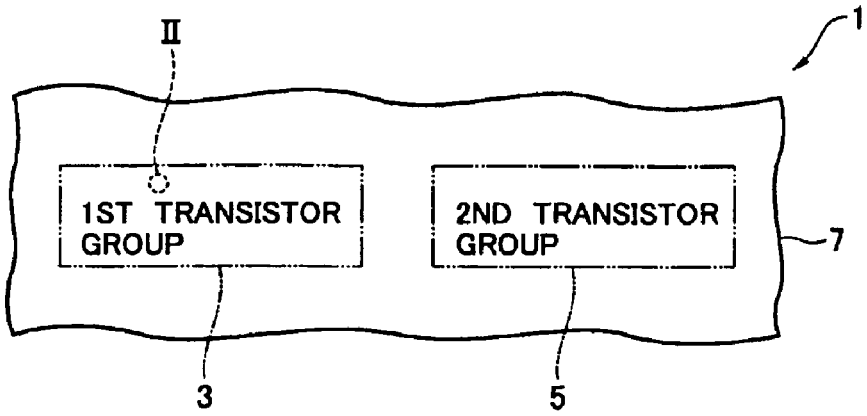
FIG. 1 is a diagram pictorially representing part of a flat surface of a semiconductor device in accordance with this embodiment.

With a thickness of 5 to 6 nanometers (nm) of a gate insulating film as a boundary, the gate insulation film's resistance property to or "withstandability" against chargeup damages gets higher as the thickness of the gate insulation film becomes smaller. Based on this, this embodiment has one of its features that the antenna ratio differs in maximal value in compliance with the thickness of the gate insulation film. This embodiment will be explained with reference to the accompanying drawings below. It should be noted in the drawings that regarding parts or components which are the same as those indicated by the reference characters that have been explained previously, the same reference characters are added thereto with an explanation thereof omitted.

[Arrangement of Semiconductor Device]

FIG. 1 is a diagram pictorially showing part of a plain surface of a semiconductor device 1 in accordance with this embodiment. The semiconductor device 1 has a structure in which a first transistor group 3 and a second transistor group 5 that is positioned next thereto are mixed and mounted together on a semiconductor substrate 7. Each transistor group 3, 5 is (a) a functional block which is made up, for example, of several or a great number of MOS field effect transistors (MOS field effect transistors are simply referred to as transistors in some cases), (b) a functional circuit such as an inverter, a logic gate (such as NOR, NAND, AND, OR or the like), a register, an adder, a multiplier, a divider, a decoder, a memory cell array or else, or (c) an ensemble or assembly of a plurality of MOS field effect transistors which have no functions.

Figure 2:
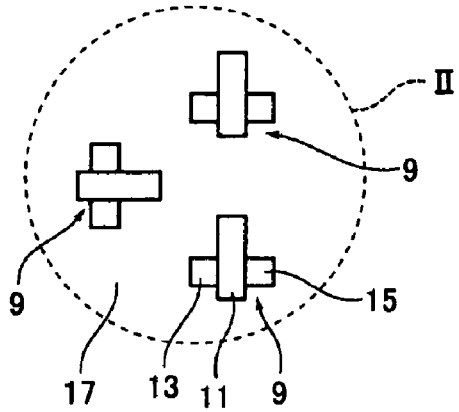
FIG. 2 is an enlarged view of a portion of a first transistor group of FIG. 1, which is indicated by II.

FIG. 2 is an enlarged view of a portion of the first transistor group of FIG. 1, which portion is indicated by "II." In FIG. 2, three MOS field effect transistors 9 are visible. A transistor 9 includes a gate electrode 11 and source/drain regions 13 and 15 which are located on the both sides thereof. The "source/drain" refers to an impurity-doped region which has at least either one of the functions of a source and a drain. Respective transistors 9 are electrically separated and isolated from one another by an element-isolating dielectric film 17.

Figure 3:
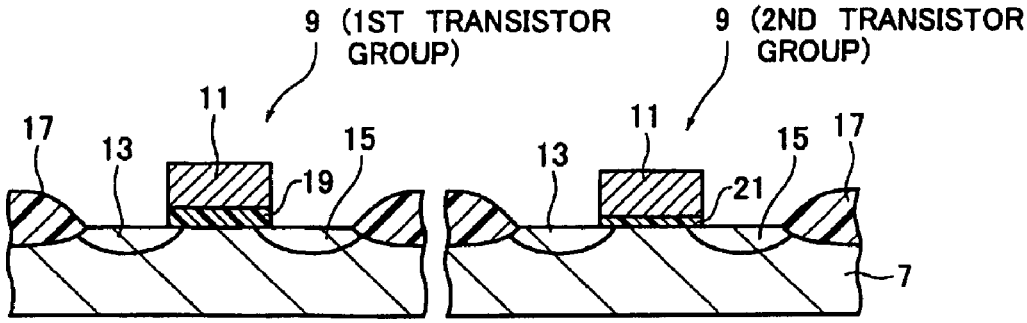
FIG. 3 is a pictorial representation of a cross-section of a MOS field effect transistor of the first transistor group of FIG. 1 and that of a MOS field effect transistor of a second transistor group.

FIG. 3 is a pictorial representation of cross-sections of one of the plurality of transistors 9 in the first transistor group 3 and one of the plurality of transistors 9 in the second transistor group 5. Gate insulation films 19 of the plurality of transistors 9 making up the first transistor group 3 are all the same in thickness; for example, the thickness is 5.0 nm. All of gate insulation films 21 of the transistors 9 that constitute the second transistor group 5 also are the same in thickness—for example, 2.5 nm. In this way, the thickness of the gate insulation film 19, 21 is less than or equal to 6.0 nm, wherein the thickness of gate insulation film 21 is less than the thickness of gate insulation film 19. Additionally the gate insulation film 19, 21 is a silicon oxide film ($SiO_2$, SiON).

Figure 4:
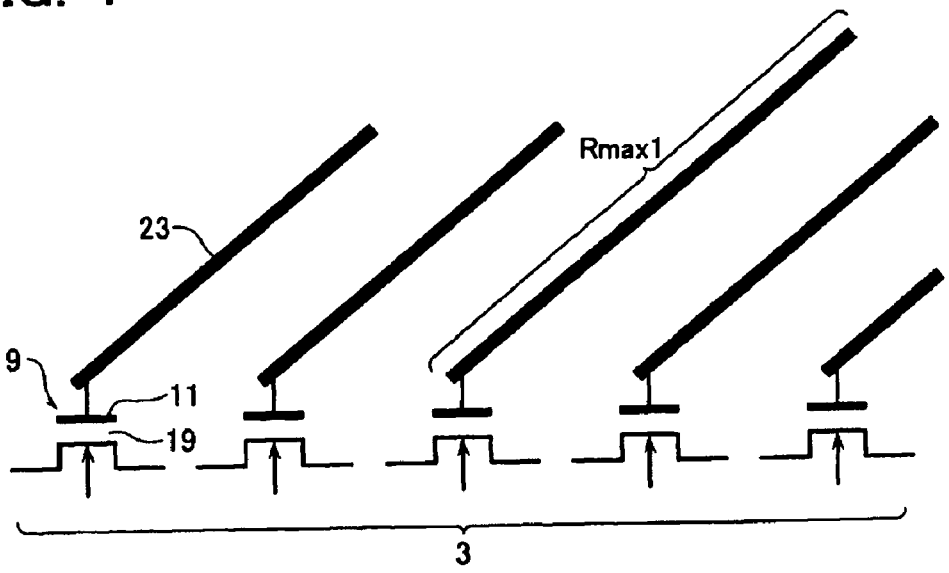
FIG. 4 is a pictorial diagram of MOS field effect transistors and wiring lines of the first transistor group of FIG. 1.
Figure 5:
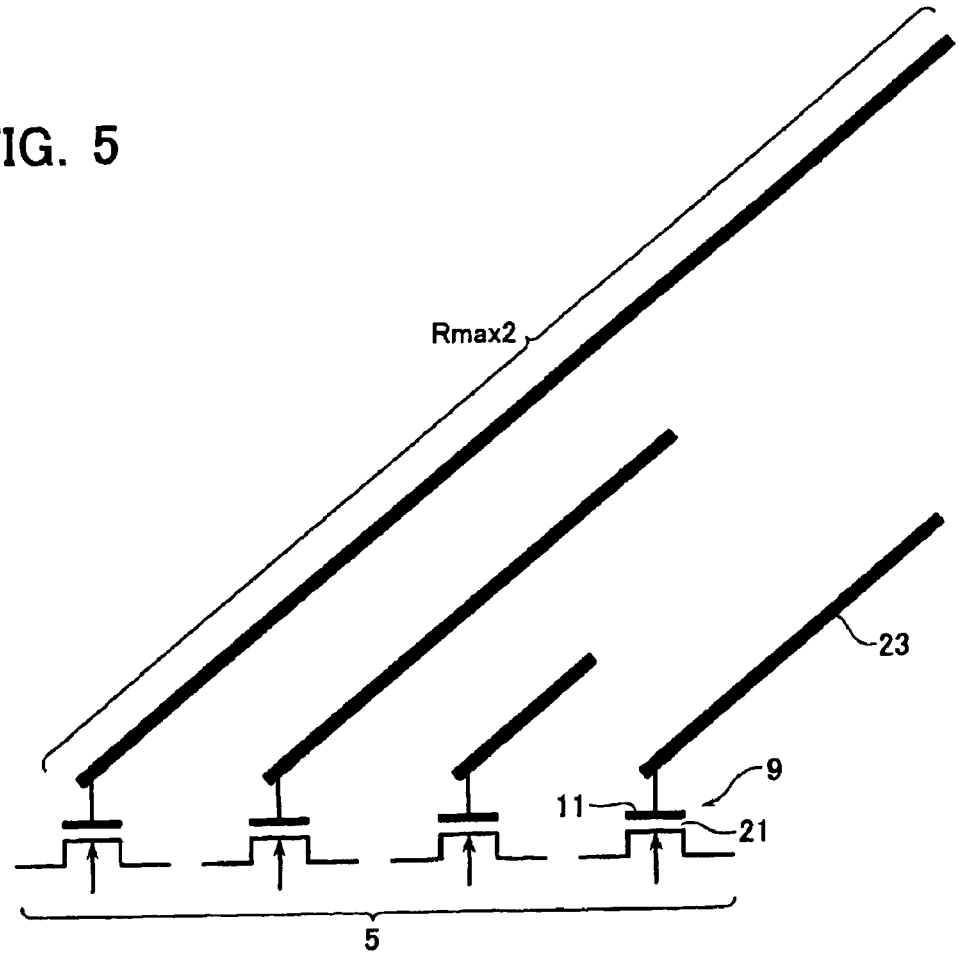
FIG. 5 is a pictorial diagram of MOS field effect transistors and wires of the second transistor group of FIG. 1.

FIG. 4 is a pictorial representation of pairs of transistors 9 and electrical wiring lines 23 in the first transistor group 3, wherein five pairs are depicted. FIG. 5 is a pictorial diagram of pairs of transistors 9 and wires 23 in the second transistor group 5, wherein four pairs are visible. The plurality of transistors 9 making up each transistor group 3, 5 are indicated by circuit symbols. A gate electrode 11 of each transistor 9 is associated with a corresponding wire 23 connected thereto. Although the wires 23 are indicated by straight lines, this is in order to compare the length of each wire 23. Accordingly, the wires 23 are actually laid out in every possible direction.

[Antenna Ratio]

Figure 6:
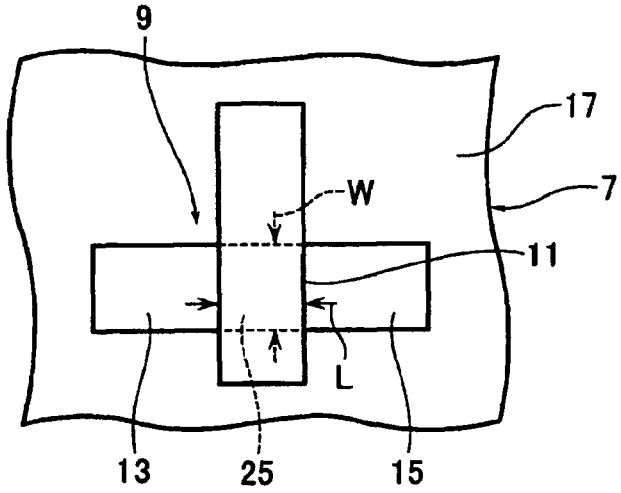
FIG. 6 is a pictorial diagram of a plan view of a MOS field effect transistor of FIG. 3.

The antenna ratio is represented by (area of wiring line)/(gate area of gate electrode). In short, the antenna ratio is a ratio of the area of a wire connected to a single gate electrode versus the gate area of this gate electrode. Regarding the gate area and the wire area, a detailed explanation will first be given of the gate area. FIG. 6 is a pictorial diagram of a plan view of a transistor 9. The gate area is meant by the area of a portion of a conductive film making up the gate electrode 11, which portion opposes a channel region 25. In other words, the gate area is (gate length L)×(gate width W). For example, in case the gate length L is 0.4 nm and the gate width W is 5.0 nm, the gate area becomes equal to 2.0 $nm^2$.

Figure 7:
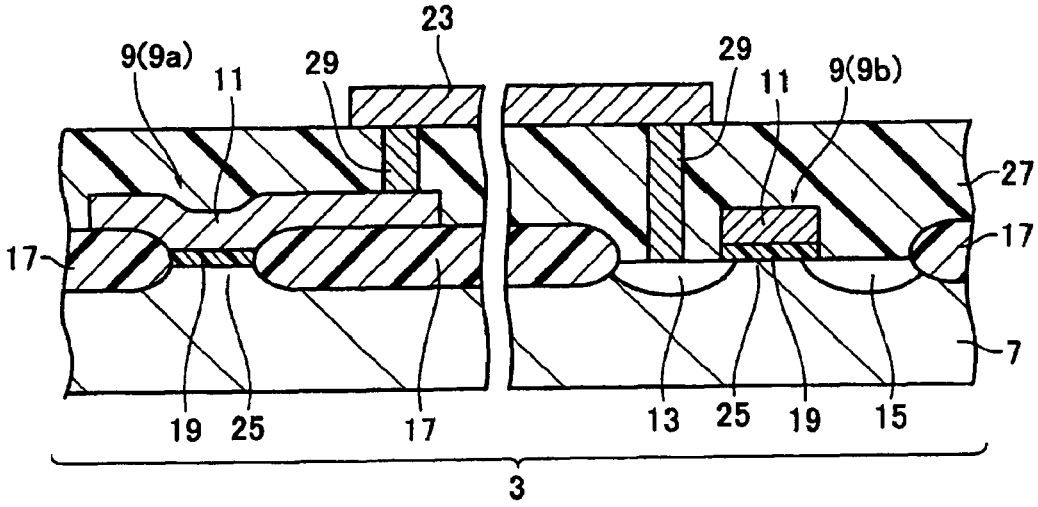
FIG. 7 is a pictorial diagram of cross-sections of two MOS field effect transistors which are included in the first transistor group of FIG. 1.

On the other hand, the area of a wire is as follows. FIG. 7 is a pictorial diagram of cross-sections of two transistors 9a and 9b in the first transistor group 3. The transistor 9a and transistor 9b are different in direction of cross-section from each other. An interlayer dielectric film 27 is formed on or above the semiconductor substrate 7 in such a manner as to cover gate electrodes 11. In the interlayer dielectric film 27, two plugs 29 are buried. One plug 29 is connected to a gate electrode 11 of transistor 9a. The other plug 29 is connected to a source/drain 13 of transistor 9b. Formed on the interlayer dielectric film 27 is a wiring line 23 which is connected to the one and the other plugs 29. From the foregoing, it is understood that the illustrative structure is such that the gate electrode 11 of transistor 9a is connected to the source/drain 13 of transistor 9b. The wire area is the area of a wire that is connected to the gate electrode 11, that is, the area of wire 23.

[Charge-Up Damage and Thickness of Gate Insulation Film]

Figure 8:
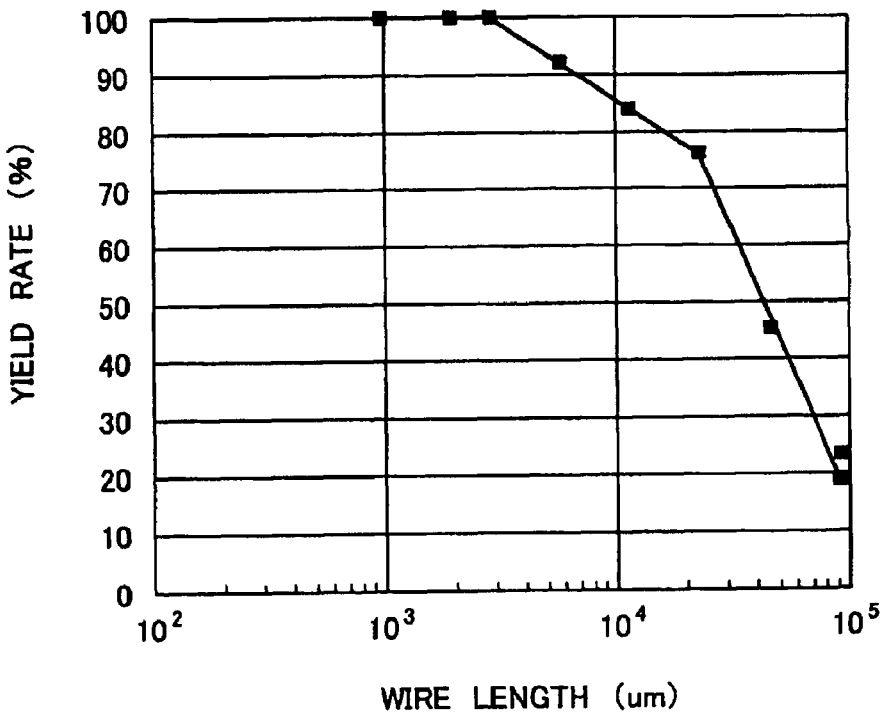
FIG. 8 is a graph showing a relationship of the length of a wire versus a good product rate of MOS field effect transistors.

It will be explained that when the antenna ratio becomes larger, the characteristics of MOS field effect transistors are degraded due to the charge-up damage of gate insulation film. FIG. 8 is a graph for explaining this. Its vertical axis is the good product rate or "yield rate" of MOS field effect transistors. In case a current Ig that flows between a gate electrode and semiconductor substrate is $Ig<10^{-9}$ A for example when applying a prespecified voltage to the gate electrode in the state that both of the source and drain and the semiconductor substrate are coupled to ground, let it be a good product. On the other hand, the lateral axis is the length of wiring line. By making the gate area and the wire width constant, the length of wire is an alternative to the antenna ratio. In short, this means that as the length of wire becomes larger, the antenna ratio also gets larger; the less the wire length, the less the antenna ratio. While the good product rate is 100% within a range of from 1000 to 3000 μm in length of wire, defective products can generate when it becomes larger than 3000 μm. As the wire length increases, the good product rate decreases.

Incidentally, a permissible or allowable value of the antenna ratio is a value which is used at the stage of semiconductor device design. Design is done in such a way that a maximal value of the antenna ratio becomes less than or equal to the allowable value of the antenna ratio. Whereby, it is avoided that MOS field effect transistors deteriorate due to the charge-up damage of gate insulation film. For example, in FIG. 8, when setting at 480 times the antenna ratio in the case of the wire with its length of 3000 μm, the allowable value of the antenna ratio is set, for example, at 450 times with a little margin included therein. When designing the layout of wires, the maximum length of wires connected to gate electrodes are determined so that the antenna ratio does not exceed 450 times.

As apparent from the explanation above, it is necessary to determine the antenna ratio (wire length) while taking the charge-up damage into consideration. Meanwhile, it is known that the influence of the chargeup damage differs depending upon the thickness of gate insulation film. For example, on pages 42 to 49 of a prior art document (1998 3rd International Symposium on Plasma Process-Induced Damage, June 4-5, Honolulu, Hi., USA. This reference is incorporated by reference.), it has been explained (on page 49) that the damage due to a plasma process becomes a peak when the thickness of a gate oxide film is at 5 to 7 nm; it is explained (on page 44) that the damage becomes a peak at 5.8 nm of the gate oxide film thickness. Based on these teachings, it is supposed in this embodiment that the peak of the chargeup damage exists at 5.0-6.0 nm of the thickness of gate insulation film.

As can be seen from the above-identified prior art document, when the thickness of gate insulation film becomes slammer than the thickness that becomes a peak of damage, the charge-up damage resistivity or withstandability gets higher. This is due to the physical phenomena that the gate insulation film becomes stronger against FN stresses when the thickness of the gate insulation film decreases. To make a long story short, defects become hardly occurrable in the gate insulation film since a main cause of the flow of charged particles collected together at a gate electrode toward the semiconductor substrate through the gate insulation film becomes the one that is caused by tunnel effects.

FEATURES OF THIS EMBODIMENT

Feature 1

As shown in FIG. 3, in case the thickness of the gate insulation film 19 of the first transistor group 3 is 5.0 nm and the thickness of gate insulation film 21 of the second transistor group 5 is 2.5 nm, the allowable value of the antenna ratio is such that the first transistor group 3 becomes less than the second transistor group 5. Accordingly, when determining the length of wiring lines of the first, second transistor group with the allowable value of the antenna ratio of first transistor group 3 being as a reference, the length of wires is needlessly limited in the second transistor group 5. In other words, regardless of the fact that sufficient resistance is available with respect to the charge-up damage of gate insulation film in the second transistor group 5, it happens that it is a must to lay out for one or some of the wires dividing the wires into portions, Because above one or some of the wires exceed the allowable value of the antenna ratio of first transistor group 3.

Allowable values of variations of the characteristics (Vth, Gm, S-factor, Ig, etc.) of MOS field effect transistors are becoming strict more and more as LSIs offer high performances. In contrast, from a view point of the degree of freedom of LSI designs, it is desirable that the allowable value of wire length (area) be as large as possible.

Consequently, in this embodiment, let a maximal value of the antenna ratio vary in accordance with the thickness of a gate insulation film. In brief, the maximum value Rmax2 (for example, 3000 times) of the antenna ratio of the second transistor group 5 of FIG. 5 is set to be larger than the maximum value Rmax1 (e.g., 1000 times) of the antenna ratio of the first transistor group 3 of FIG. 4. This is based on the fact that the thickness of the gate insulation film 21 of second transistor group 5 is less than the thickness of the gate insulation film 19 of first transistor group 3 so that the second transistor group 5 is higher in charge-up damage withstandability than the first transistor group 3.

As stated above, according to this embodiment, the allowable value of the length of wires becomes larger in the second transistor group 5 since the maximum value of the antenna ratio of second transistor group 5 is set at Rmax2 which is larger than Rmax1. Thus it is possible to enhance the degree of freedom for layout of wires; as a result, it is possible to lessen the area of the semiconductor device. In recent years, there are many cases where a plurality of transistors which are less than or equal to 5.0 nm in thickness of gate insulation film and are different from one another in gate insulation film thickness are mixed and mounted together on a single semiconductor chip; thus, this embodiment is effective.

Additionally, when the antenna ratio goes beyond a predetermined value, the characteristics of transistors 9 deteriorate due to the charge-up damage. Based on this, in this embodiment, let the maximum value of the antenna ratio of each transistor group 3, 5 be less than the above-noted predetermined value. Thus it is possible to suppress and restrain the chargeup damage with respect to each of the gate insulation film 19 of first transistor group 3 and the gate insulation film 21 of second transistor group 5.

Note that in this embodiment, in order to permit the length of wire 23 to be an alternative to the antenna ratio, it has been explained under an assumption that all the wires 23 are the same in width and at the same time the gate areas of all the transistors 9 are the same. However, the widths of wires 23 and/or the gate areas may be different.

Also note that in the second transistor group 5, it is not necessary that all the antenna ratios of the pairs made up of the transistors 9 and wires 23 be larger than Rmax1: in some pairs, it may be less than Rmax1.

Additionally, even in cases where the thicknesses of gate insulation films are of more than three kinds, this embodiment can be applied. For example, the thickness of gate insulation film of the first transistor group is 5.5 nm, the thickness of gate insulation film of the second transistor group is 2.5 nm, and the thickness of gate insulation film of a third transistor group is 1.0 nm. Assume that the maximum value of the antenna ratio is such that the first transistor group is Rmax1, the second transistor group is Rmax2, and the third transistor group is Rmax3. In this case, it is possible to cause Rmax2 to be larger by one order of magnitude than Rmax1 and also make Rmax3 larger than Rmax2 by one order of magnitude.

Therefore, Rmax3 is expected to be larger by two orders of magnitude than Rmax1. Although the maximum value of antenna ratio may be determined per transistor group so that Rmax1<Rmax2<Rmax3, another setting of Rmax1< Rmax2=Rmax1 may be employed.

Figure 9:
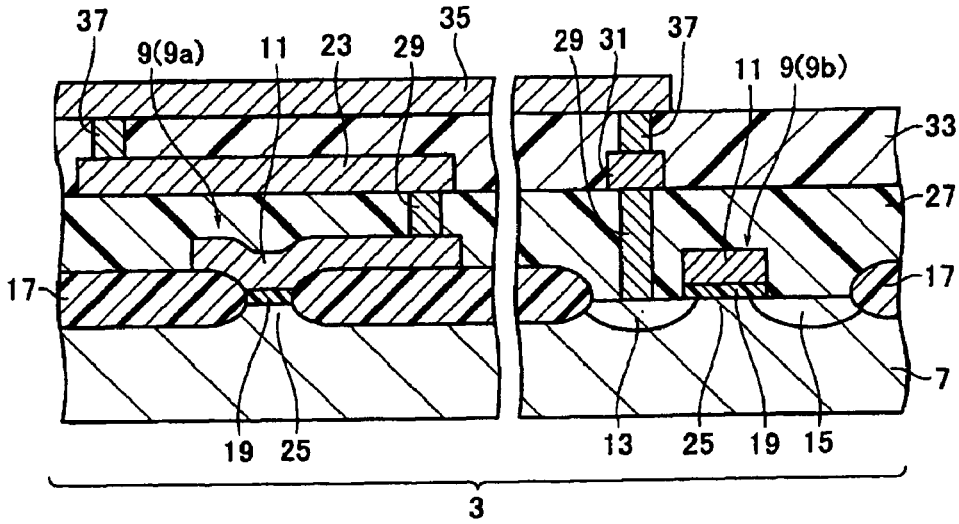
FIG. 9 is a pictorial diagram of a cross-section of a multilayered wire that is positioned in the first transistor group of FIG. 1.

In addition, in the case of multiple-layered wiring lines, the area of wire can be defined in a way which follows. FIG. 9 is a diagram pictorially representing a cross-section of a multi-layered wire which is positioned in the first transistor group 3 of FIG. 1, which diagram corresponds to FIG. 7. A pad 31 which was formed at the same time during formation of a first layer of wire 23 is placed on an interlayer dielectric film 27. The pad 31 is connected to a plug 29 which is located above a source/drain 13. An interlayer dielectric film 33 is formed in such a manner as to cover the wire 23 and the pad 31. A second layer of wire 35 is placed on the interlayer dielectric film 33. One terminate end of the wire 35 is connected by a plug 37 to the wire 23; the other end thereof is connected by a plug 37 to the pad 31. Therefore, the gate electrode 11 of a transistor 9a and the source/drain 13 of a transistor 9b are connected together.

Figure 10:
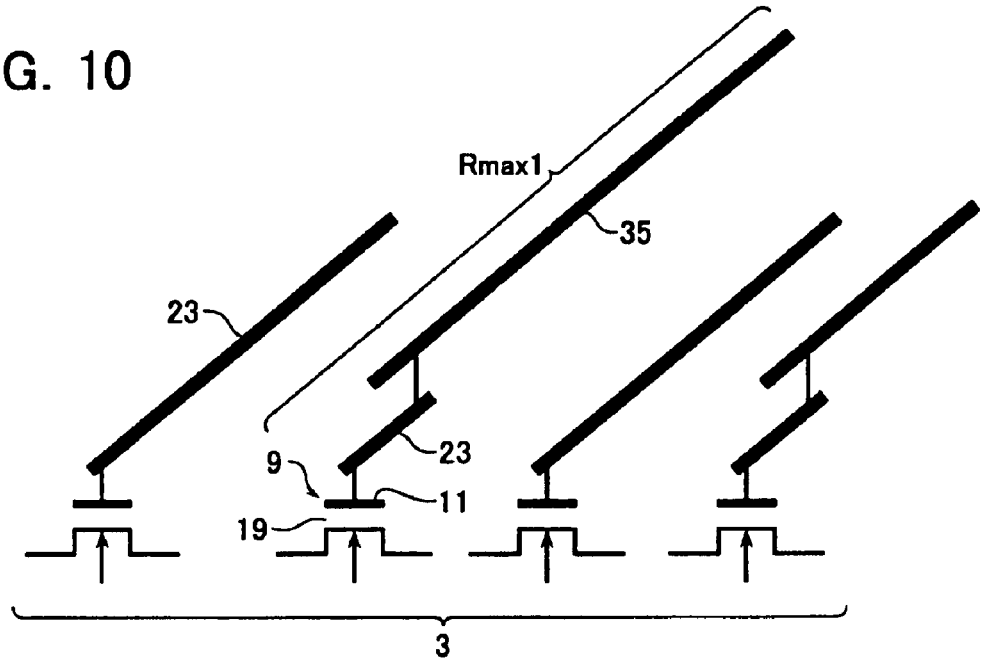
FIG. 10 is a pictorial diagram of MOS field effect transistors and multilayered wires of the first transistor group of FIG. 1.
Figure 11:
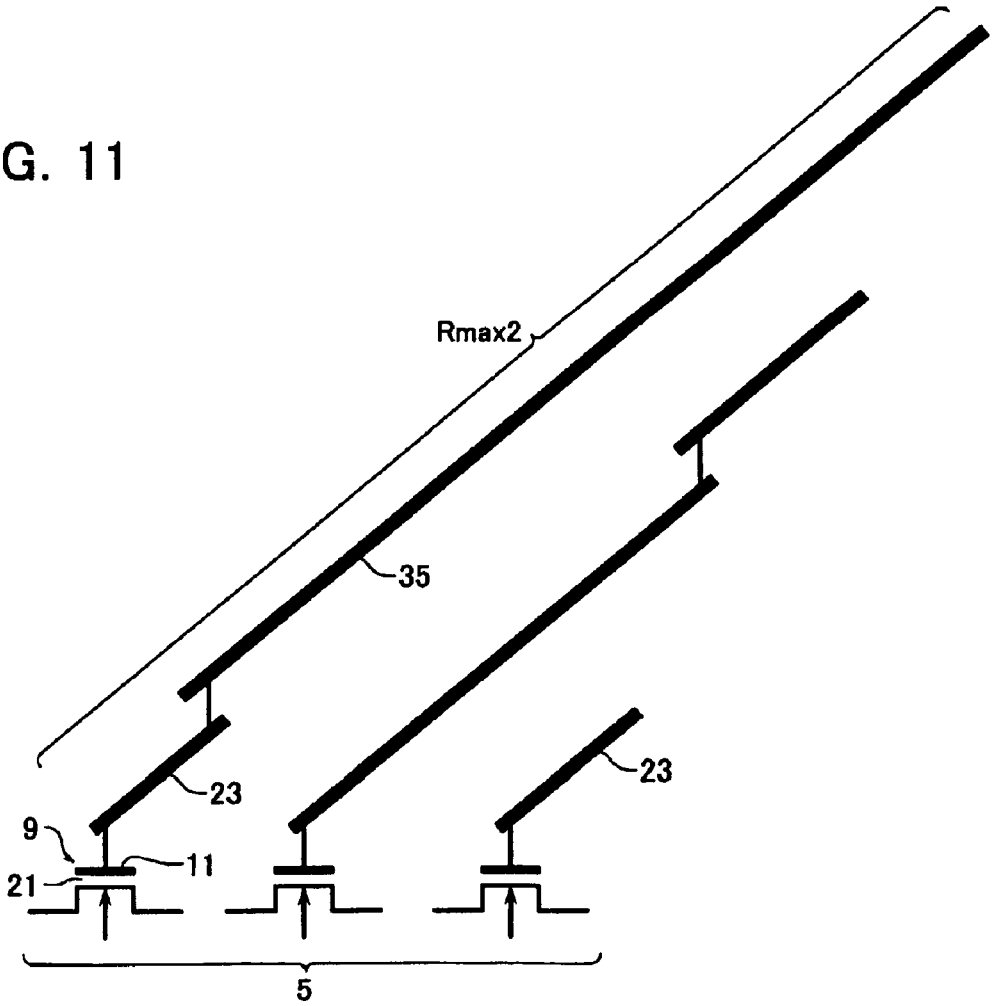
FIG. 11 is a pictorial diagram of MOS field effect transistors and multilayer wires of the second transistor group of FIG. 1.

FIG. 10 is a pictorial representation of MOS field effect transistors and multilayered wiring lines of the first transistor group, which corresponds to FIG. 4. On the other hand, FIG. 11 is a pictorial diagram of MOS field effect transistors and multilayer wires of the second transistor group, which corresponds to FIG. 5. In the case of such multilayer wiring, the area of a wire is a total area with a sum of areas of respective layers of a multilayer wire. Accordingly, in this example, the wire area is a total value of an area of first layer of wire 23 and an area of second-layer wire 35.

Feature 2

As the definitions of the area of wire, there are the ways (a) to (f) which follow.

Figure 12:
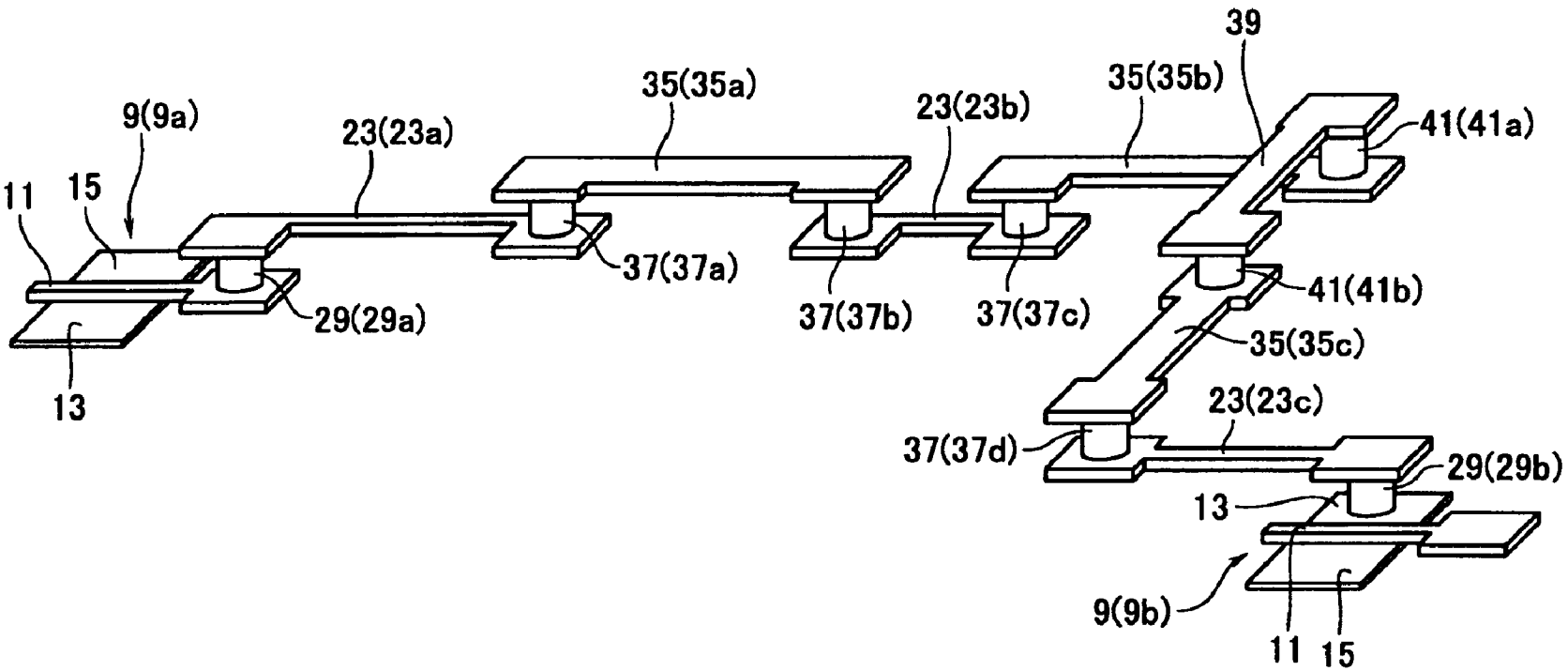
FIG. 12 is a diagram showing that one transistor and the other transistor are connected together by utilization of a three-layered wire in this embodiment.

(a) In the case of multilayer wiring, the area of a wire may be defined in a way which follows. FIG. 12 is a diagram showing that the gate electrode 11 of transistor 9a and the source/drain 13 of transistor 9b are connected together by utilizing a three-layer wiring technique. Saying a conclusion first, the area of a third-layer wire 39 is left out of consideration for the calculation of the wire area. The reason of this will be explained by use of fabrication processes of the multilayer wiring structure. FIGS. 13 to 17 are diagrams showing formation processes of the multilayer wire shown in FIG. 12.

Figure 13:
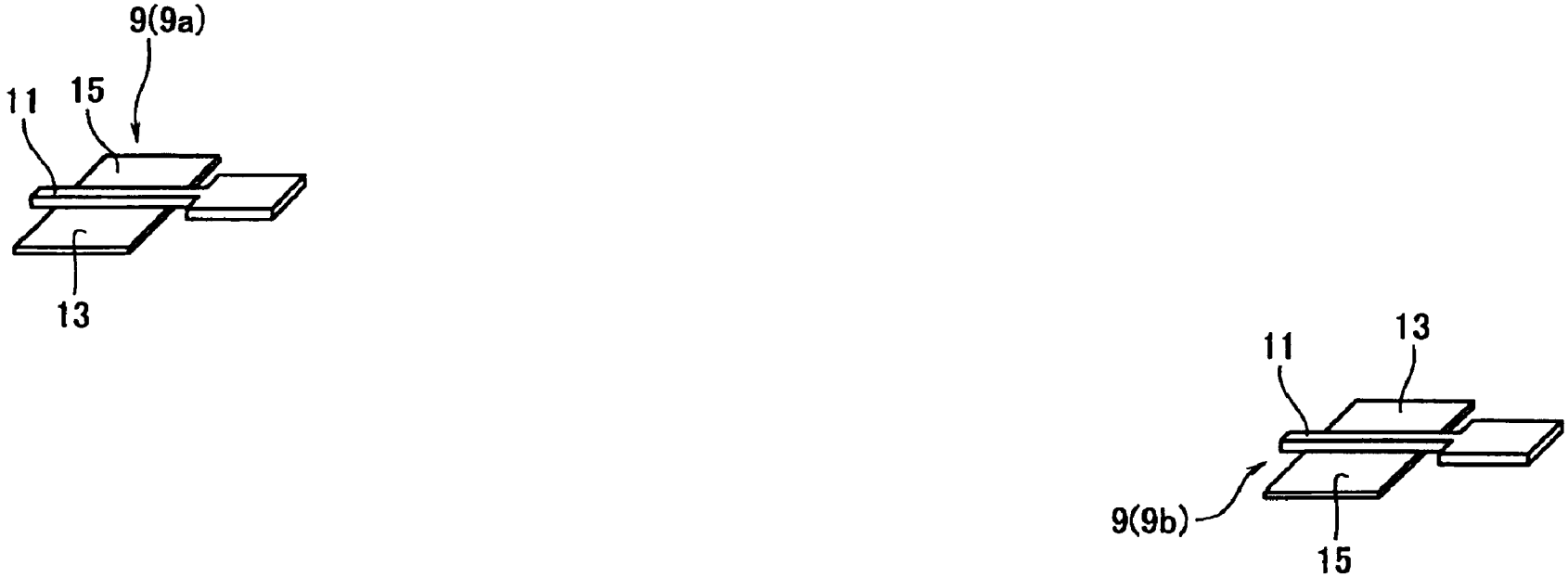
FIG. 13 is a first process step diagram for explanation of formation of the multilayered wire shown in FIG. 12.
Figure 15:
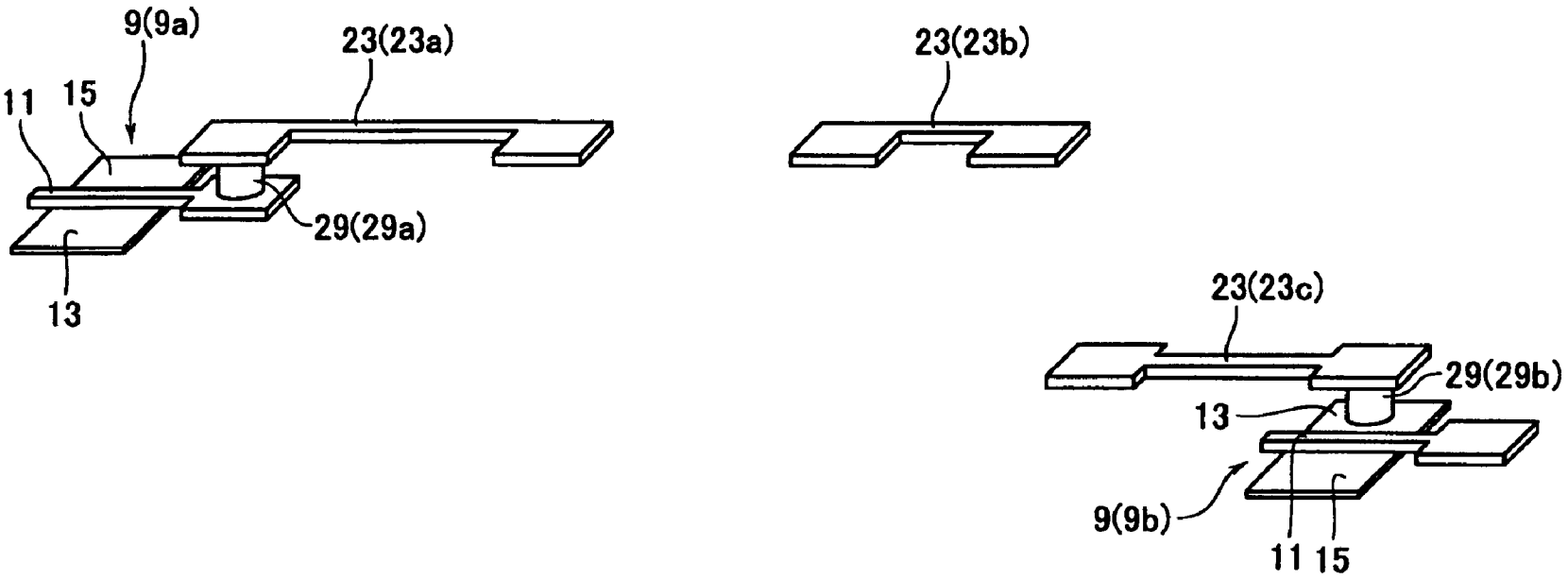
FIG. 15 is a third step diagram for explanation of formation of the multilayer wire shown in FIG. 12.
Figure 16:
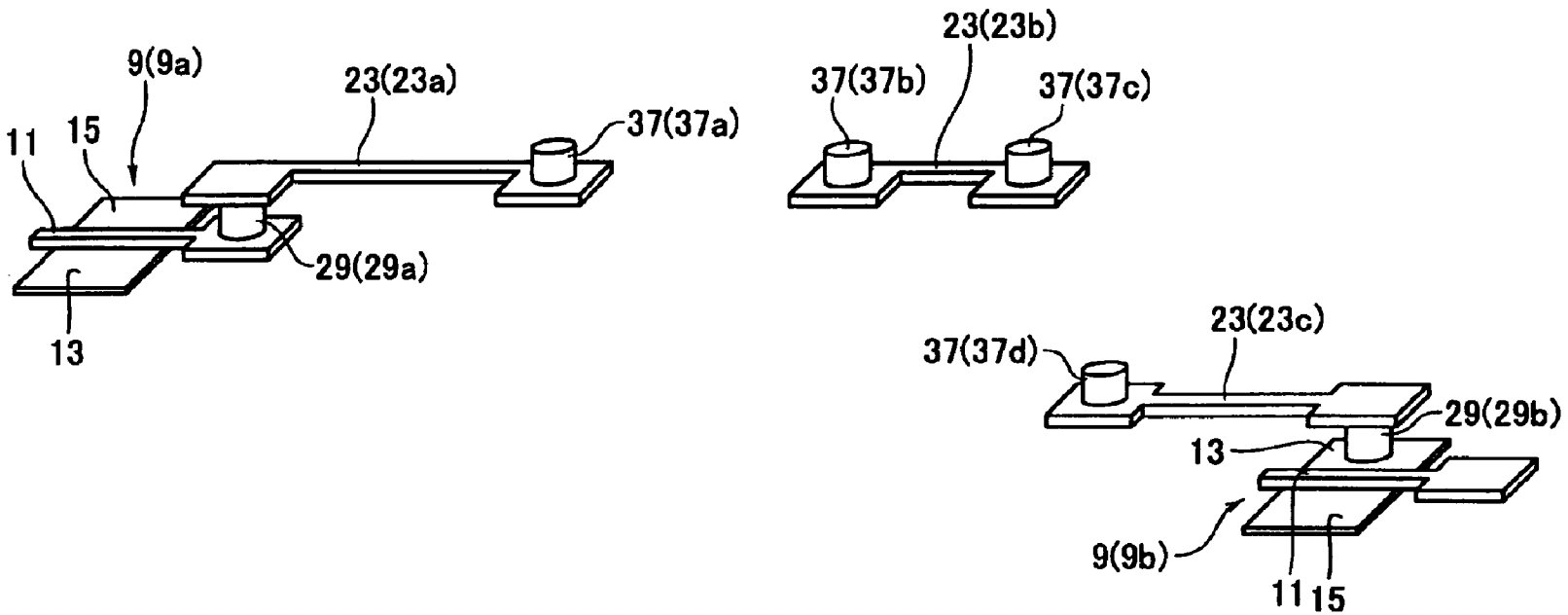
FIG. 16 is a fourth step diagram for explanation of formation of the multilayer wire shown in FIG. 12.
Figure 17:
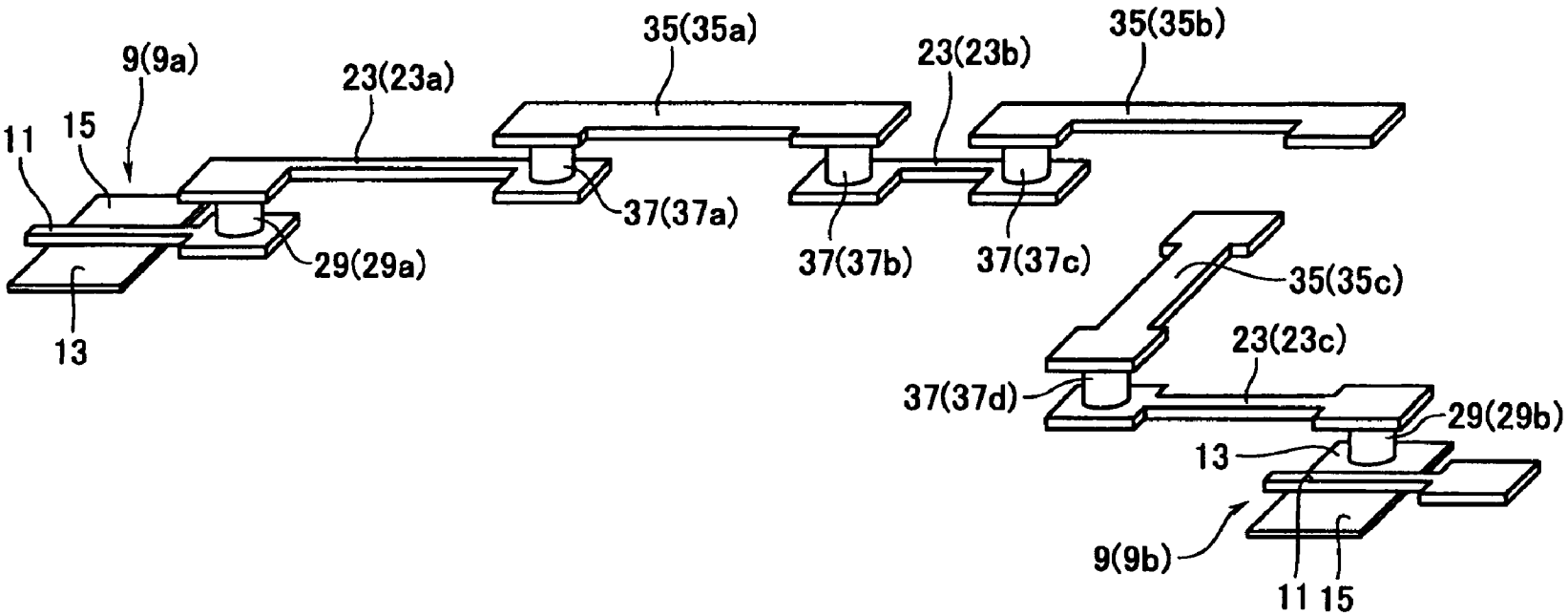
FIG. 17 is a fifth step diagram for explanation of formation of the multilayer wire shown in FIG. 12.

As shown in FIG. 13, fabricate transistors 9a and 9b on a semiconductor substrate. As shown in FIG. 14, form a plug 29a for connection to the gate electrode 11 of transistor 9a and a plug 29b for connection to the source/drain 13 of transistor 9b. As shown in FIG. 15, form a first layer of wires 23a-23c. As shown in FIG. 16, form plugs 37a-37d for connection to the wires 23. As shown in FIG. 17, form a second layer of wires 35a-35c for connection to the plugs 37. Lastly, as shown in FIG. 12, form plugs 41a-41b and then form a third layer of wire 39.

By formation of the third-layer wire 39, the gate electrode 11 and the source/drain 13 (semiconductor substrate) are conducted together. As the semiconductor substrate is grounded, at the time of forming the third-layer wire 39, charged particles that are collected at the third-layer wire 39 flow toward the source/drain 13 through the third-layer wire 39, the second-layer wire 35c and the first-layer wire 23c. Due to this, the gate insulation film underlying the gate electrode 11 does not receive any charge-up damage. Thus, it is no longer required to take account of the area of the third-layer wire 39 for the calculation of the wiring area.

When defining the wiring area in this way, this approach becomes effective in the case which follows: if the area of the third-layer wire 39 is not considered for the wiring area then the antenna ratio does not go beyond the allowable value in any way, considering it results in the ratio exceeding the allowable value. This is because the layout of wires must be done again or "redone" whenever the antenna ratio exceeds the allowable value. As stated above, according to this embodiment, it is possible to prevent the wiring area from becoming unnecessarily large; thus, it is possible to lessen redoing or retrial of the layout.

Although the explanation above is directed to the case of the three-layer wiring, a generalized explanation is as follows. In case a gate electrode and a semiconductor substrate are conducted together by the n-th ("n" is an integer more than or equal to 2) layer of a multilayer wiring line, the area of a wire is a total area with a sum of areas of gate electrode-connected portions of respective layers up to the (n−1)th layer of the multilayer wire at the stage of having formed the multilayer wire up to its (n−1)th layer. Explaining in the case of FIG. 12, the area of the wire becomes a total area with a sum of areas of the first-layer wires 23a-23b and areas of second-layer wires 35a-35b. Note here that the portion of interest should not be limited to the source/drain and may be a well region for example, since what is required here is that the gate electrode is conducted with the semiconductor substrate.

(b) Alternatively, the area of the multilayer wire may be defined in a way which follows. In the above-noted (a), it has been explained that the wiring area is a total area with a sum of areas of the first-layer wires 23a-23b and second-layer wires 35a-35b. However, the area of the wire may be defined without taking the first-layer wire 23b into consideration. This reason will be set forth below.

As shown in FIG. 15, at the time of forming the first-layer wires 23 and the interlayer dielectric film that covers these wires, the wire 23b is not yet conducted with the gate electrode 11 so that it will never happen that charged particles gathered at the exposed wire 23b flow toward the gate electrode 11. Accordingly, the wire 23b does not affect the charge-up damage in any way so that this may not be considered for the wiring area.

Saying the above in a general way, the area of a wire is a total area with a sum of areas of exposed portions in the state that these are conducted with a gate electrode during manufacturing processes of a semiconductor device. According to this, it is possible to prevent the wiring area from unnecessarily becoming larger, which in turn makes it possible to lessen risks of redoing the layout.

(c) Upon manufacturing of a semiconductor device, there is a stage that a plug or plugs are exposed: at this stage, charged particles are collected together to such plugs. Hence, by adding the area of the plugs (area of upper surfaces) to the wiring area, it is possible to design the layout of wires while more accurately taking account of the influenceability of charge-up damages. Explaining more practically, add the areas of the plug 29a shown in FIG. 14 and the plug 37a shown in FIG. 16 plus the plug 41a shown in FIG. 12 to the wiring area. Areas of the other plugs are out of consideration because the other plugs are not conducted with the gate electrode 11 at the time of forming the other plugs.

Figure 18:
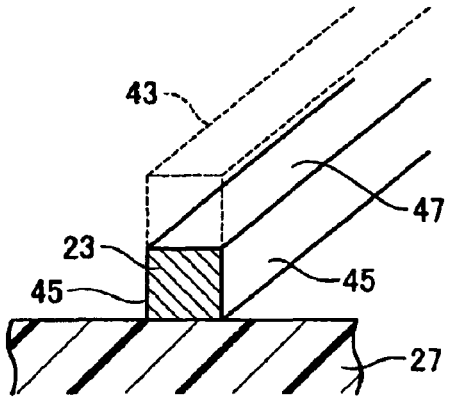
FIG. 18 is a diagram showing a wire as formed by reactive ion etching.

(d) In case wires are formed by reactive ion etching, the wiring area is defined in a way which follows. FIG. 18 shows a wiring line 23 which was formed on an interlayer dielectric film 27. With a resist 43 as a mask, selectively etch a conductive film such as aluminum by reactive ion etching so that the wiring line 23 is formed. At this etching step, both side surfaces 45 of the wire 23 are exposed. Charged particles that were utilized at the etching step come together at the both side surfaces 45. Additionally, after having removed the resist 43, when forming an interlayer dielectric film covering the wire 23 by plasma CVD, the both side faces 45 and an upper face 47 of the wire 23 are exposed to a plasma atmosphere. Therefore, the wiring area is a total area with a sum of areas of the both side faces and the upper face of the wire. According to this, it is possible to design the wiring layout while more accurately taking account of the influenceability of the charge-up damage.

Figure 19:
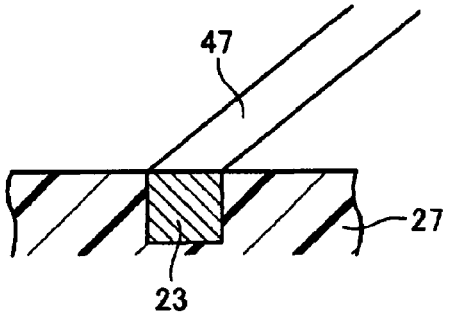
FIG. 19 is a diagram showing a wire formed by damascene.

(e) In the case of forming a wiring line by use of damascene, the area of a wire is an area of an upper surface of the wire. This will be explained in FIG. 19. FIG. 19 is a diagram showing a wiring line 23 that was formed by damascene. The damascene is a process for forming a conductive film made of copper or the like on an interlayer dielectric film 27 with a concave portion formed therein and then polishing or rubbing this conductive film by chemical-mechanical polish (CMP) techniques to thereby form the wire 23 which is buried in the interlayer dielectric film 27. At the formation process step of the wire 23, no plasmas are used so that any charged particles are never gathered to the wire 23. Upon forming of this interlayer dielectric film covering the wire 23 by plasma CVD, an upper surface 47 of the wire 23 is exposed to the plasma atmosphere. Therefore, the area of the wire becomes equal to an area of the upper face of the wire ((wire width)× (total wire length)). According to this, it is possible to design the wiring layout while more accurately taking account of the influenceability of the charge-up damage.

In the generation with a gate insulation film thickness of 5 nm or less, damascene wiring becomes the mainstream. This thickness is almost identical to the thickness of a gate insulation film which becomes the subject matter of this embodiment.

Figure 20:
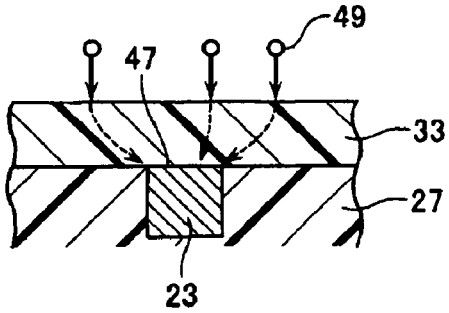
FIG. 20 is a diagram showing a process step of forming an interlayer dielectric film by plasma CVD on the damascene-formed wire.

(f) In the case of forming a wiring line by damascene, the area of such wire may be defined as (wire width+2×1.3r)× (total wire length), where r is the film thickness of a dielectric film to be deposited on or above the wire in a plasma process. In short, let an effective wire width be wider than the real wire width (reference document: Proceedings of the 2003 International Interconnect Technology Conference, pp. 198-200. This reference is incorporated by reference.). This reason will be explained below. FIG. 20 is a diagram showing a process of forming by plasma CVD an interlayer dielectric film 33 on a damascene-formed wiring line 23. At the stage that the interlayer dielectric film 33 is thin, charged particles 49 in a plasma behave to travel through the interlayer dielectric film 33 and then gather at an upper surface 47 of the wire 23. And, charged particles 49 which are incident not only to a portion of the interlayer dielectric film 33 that immediately overlies the upper face 47 but also to a diagonally overlying portion also gather together to the upper face 47. Hence, it is preferable to calculate or compute the area of a wire while widely defining the effective width (effective wire width) of an antenna in a broad sense. Whereby, it is possible to design the wiring layout while more accurately taking into consideration the influenceability of charge-up damages. Note here that when it is required that the wiring area is simply defined while taking account of the charge-up damage influenceability, it is permissible to determine the wire area as a value obtained by multiplication of a coefficient—for example, two (2)—to the area of upper face 47.

Feature 3

It is possible to use a low dielectric constant film as the interlayer dielectric film of this embodiment. Examples of such film include, but not limited to, an aromatic series-based organic film (e.g., polyallylene-ether, polyallylene-hydrocarbon, benzoxazole, benzcyclobutene), SiOC film, SiOCH film, SiOCN film, $SiO_2$ film, and SiON film.

Figure 21:
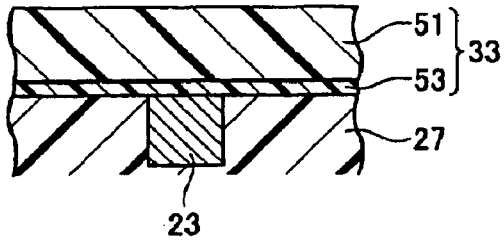
FIG. 21 is a pictorial diagram of a cross-section in which an interlayer dielectric film including an organic insulative film with a low dielectric constant is formed on a wire.

FIG. 21 is a diagram pictorially representing a cross-section in which an interlayer dielectric film 33 including a low dielectric constant film 51 is formed on the wiring line 23. The interlayer dielectric film 33 has a structure with the low dielectric constant film 51 formed on a Cu diffusion prevention film 53 (SiN, SiCN, SiOC or else). The low dielectric constant film 51 is formed by spin-on. As the spin-on is such that any charged particles are not utilized, it is possible to avoid the influence of charge-up damage.

Additionally, when forming the Cu diffusion preventive film 53 by plasma CVD, charge-up damage occurs due to this. Since the spin-on includes a thermal processing step or steps, it is also possible to recover the above-noted chargeup damage.

Feature 4

Figure 22:
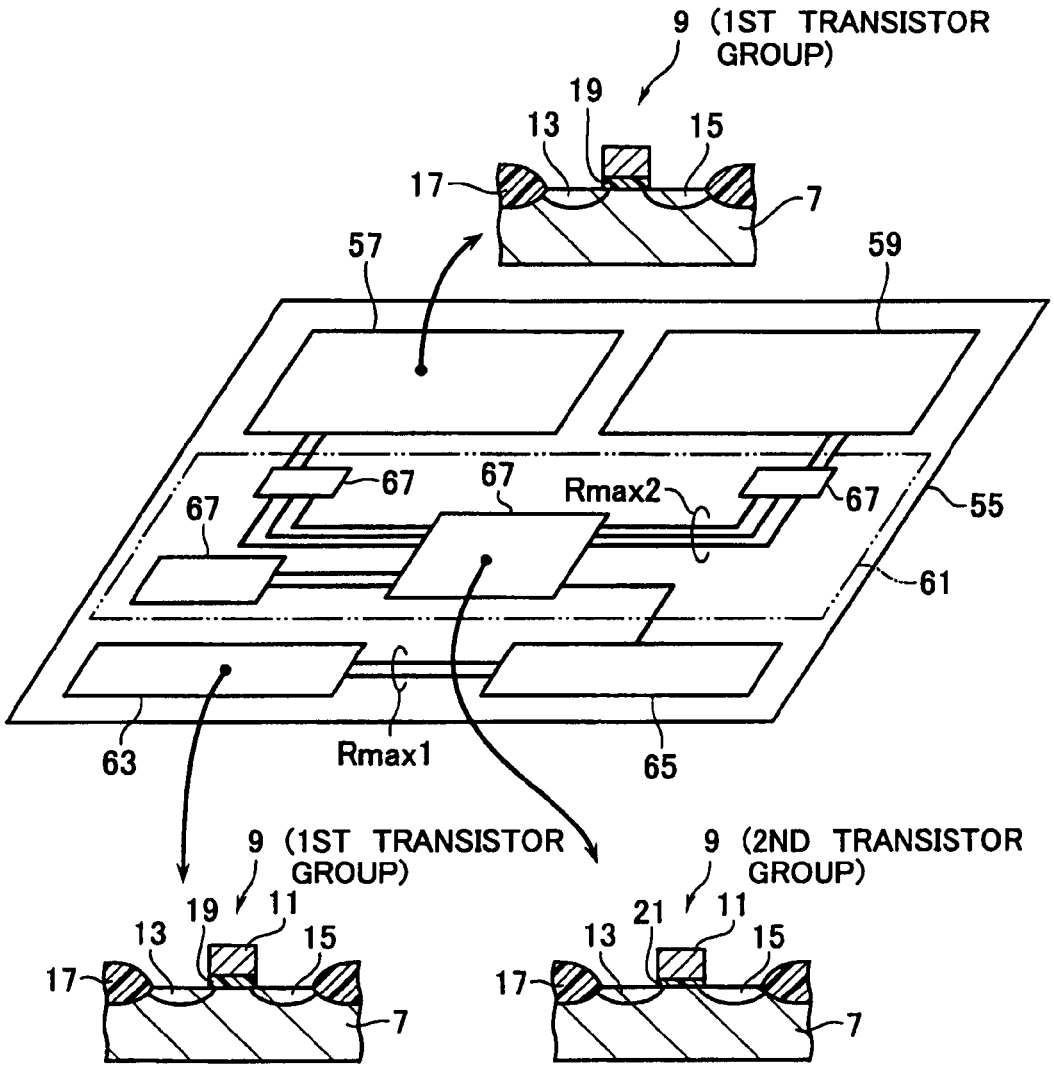
FIG. 22 is a block diagram which represents one example of a semiconductor chip in accordance with this embodiment in the form of functional blocks.

FIG. 22 is a block diagram which represents one example of a semiconductor chip in accordance with this embodiment in a functional block form. As functional blocks of the semiconductor chip 55, there are two memories 57 and 59, a logic circuit 61, and two input/output (I/O) circuits 63 and 65. The logic circuit 61 is further divided into circuit blocks 67, which are a lower level of functional blocks.

In the memory 57, 59 and I/O circuit 63, 65, these are made up of a first transistor group, wherein the thickness of a gate oxide film 19 of a transistor 9 is 5.0 nm. On the other hand, the logic circuit 61 which is required to perform high-speed operations is configured from a second transistor group, wherein the thickness of a gate insulation film 21 of transistor 9 is 2.5 nm. In the memory 57, 59 and I/O circuit 63, 65, the maximum value Rmax1 of antenna ratio is 500 times. In contrast, in the logic circuit 61, the maximum value Rmax2 of antenna ratio is 3000 times.

Since the logic circuit 61 is required to perform high-speed operations, the thickness of the transistor gate oxide film is made smaller than that in the other functional blocks. Accordingly, by letting the maximum value of antenna ratio (this can be said as an allowable value of the antenna ratio) of the logic circuit 61 be larger than that in the other functional blocks, the degree of freedom of the layout of wiring lines in logic circuit 61 is enhanced. And, by determining the rules of the antenna ratio in units of functional blocks, the layout of wires can be done relatively easily even when there are a plurality of allowable values of the antenna ratio.

It should be noted that the functional blocks made up of the first transistor group typically include a power supply circuit, analog filter circuit, direct-current (DC) operating circuit and the like. Examples of the memory 57, 59 are an EEPROM (of the NAND type or else), DRAM, and ferroelectric memory.

Feature 5

Figure 23:
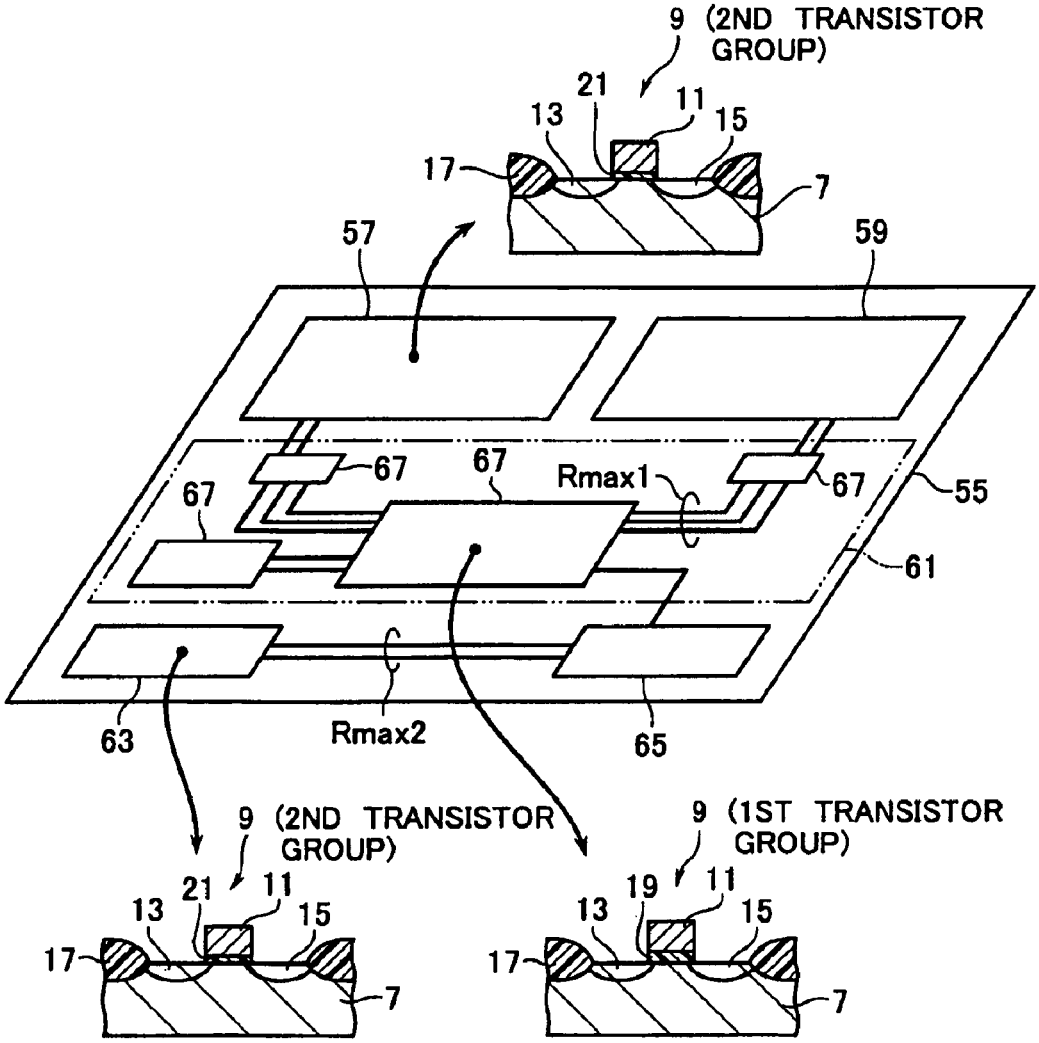
FIG. 23 is a block diagram which represents, in functional block form, another example of the semiconductor chip in accordance with this embodiment.

In this embodiment the gate insulation film permits mixed mounting of transistors of a silicon oxide film and transistors of a high dielectric film. Regarding this, an explanation will be given by using FIG. 23. FIG. 23 is a block diagram representing another example of the semiconductor chip in accordance with this embodiment in a functional block form, which diagram corresponds to FIG. 22. Adversely to the previously stated one, the logic circuit 61 is constituted from the first transistor group, whereas the memory 57, 59 and I/O circuit 63, 65 are made up of the second transistor group. The gate insulation film 19 of transistor 9 of the logic circuit 61 is a high dielectric film with its thickness of 5.0 nm. In contrast thereto, the gate insulation film 21 of transistor 9 of the memory 57 or the like is a silicon oxide film with a thickness of 2.5 nm.

Although the thickness of the gate insulation film 19 is 5.0 nm, the gate insulation film 19 is a high dielectric film so that it becomes smaller than the thickness of the gate insulation film 21—that is, less than 2.5 nm—in the case of conversing this film into that of the silicon oxide film. Hence, the transistors 9 of the logic circuit 61 become high performance transistors although they are larger in gate insulation film thickness than the transistors 9 of the memory 57 or the like. However, since the physical thickness of gate insulation film 19 is 5.0 nm, the maximum value Rmaax1 of the antenna ratio of logic circuit 61 becomes less than the maximum value Rmax2 of antenna ratio of the memory 57 or else.

The high dielectric film as used herein is a film that is higher in dielectric constant than silicon oxide films; for example, there are a hafnium oxide, hafnium silicate, zirconium oxide, and zirconium silicate.

In addition, as the functional blocks made up of the second transistor group, there are a power supply circuit, analog filter circuit, DC operating circuit and so forth. Examples of the memory 57, 59 are an EEPROM (of the NAND type or else), DRAM, and ferroelectric memory.

Feature 6

Figure 24:
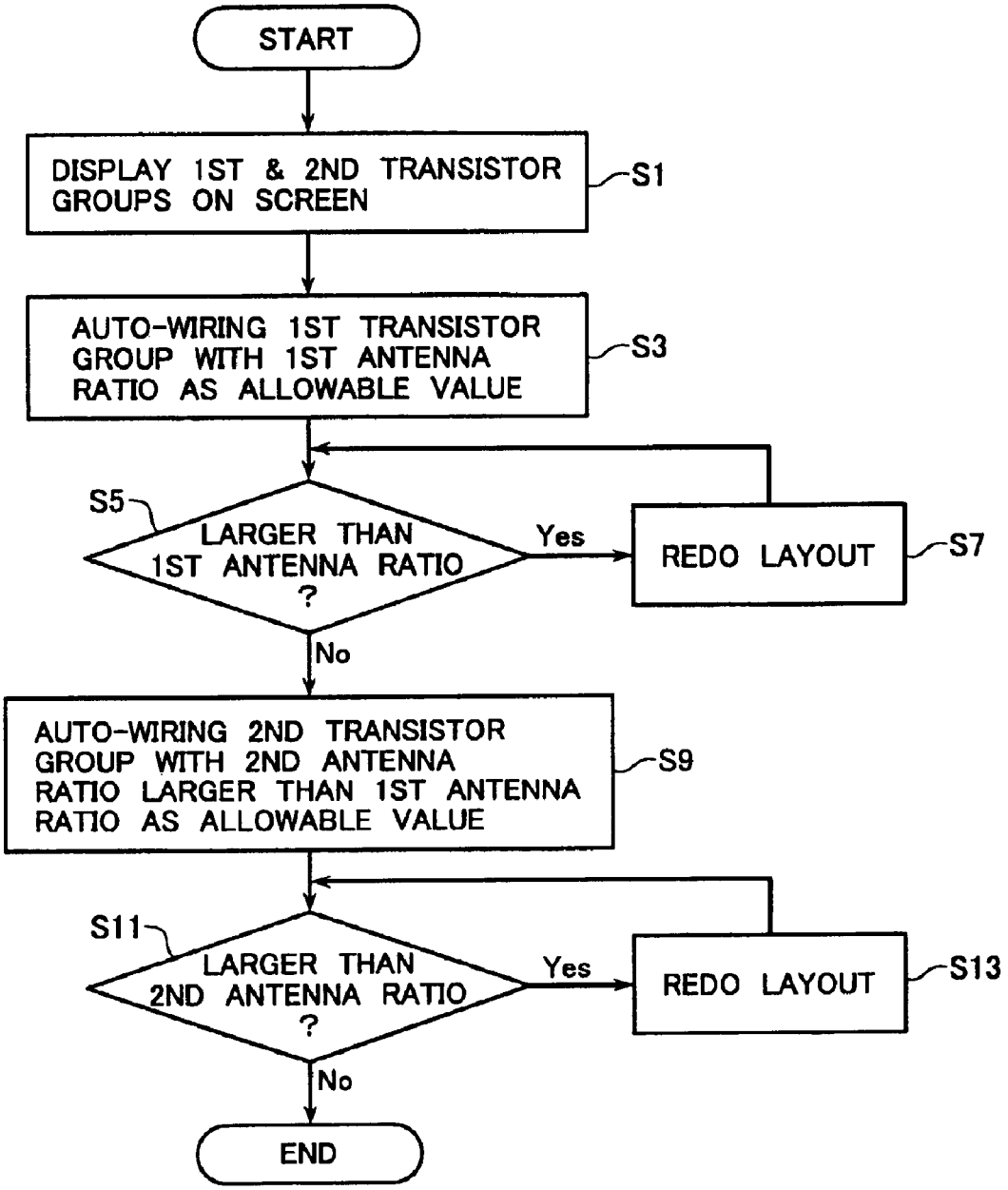
FIG. 24 is a flow chart of a design method of a semiconductor device in accordance with this embodiment.

A design method of the semiconductor device in accordance with this embodiment will be explained. FIG. 24 is a flow chart of this design method. This design method is for gate arrays or standard cells or the like and utilizes a computer.

Firstly, let the first transistor group and the second transistor group be visually displayed on a screen (at step S1). Each transistor group is such that layout positions may be predetermined or alternatively automated layout is done in the form of cells or others. Next, automatically wire or "rail" those wiring lines which correspond to respective transistors of the first transistor group on the display screen while using a first antenna ratio as an allowable value (step S3). The first antenna ratio is an allowable value of antenna ratios of the first transistor group.

Determine whether a pair whose antenna ratio becomes larger than the first antenna ratio is present in the pairs of transistors and wires of the first transistor group (step S5). If present then redo the wiring layout with respect to a wire of such pair (step S7).

When the antenna ratios of all the transistor/wire pairs of the first transistor group become less than the first antenna ratio, perform automated wiring on the display screen while letting a second antenna ratio larger than the first antenna ratio be the allowable value (step S9). The second antenna ratio is the allowable value of antenna ratios of the second transistor group. The second antenna ratio is larger than the first antenna ratio because the thickness of a gate insulation film of the second transistor group is less than the thickness of gate insulation film of the first transistor group.

In the transistor/wire pairs of the second transistor group, if there is a pair with its antenna ratio larger than the second antenna ratio (step S11), then redo the wiring layout with respect to the wire of such pair (step S13). The procedure is completed when the antenna ratios of all of the transistor/wire pairs of the second transistor group become smaller than the second antenna ratio.

As has been explained above, as per the semiconductor device in accordance with the present invention, let the maximum value of antenna ratio of the second transistor group be larger than the maximum value of antenna ratio of the first transistor group. As a result of this, it is possible to enhance the degree of freedom of the layout of wiring lines while at the same time suppressing charge-up damages. More precisely, according to the semiconductor device in accordance with this invention, the maximum values of the antenna ratios of the first and second transistor groups are set less than or equal to the above-noted allowable value, based on the fact that when the antenna ratio exceeds the allowable value, the characteristics of transistors degrade due to the charge-up damages of gate insulation films. Thus it is possible to suppress chargeup damages of gate insulation films of field effect transistors which make up the first and second transistor groups. And, as per the semiconductor device in accordance with this invention, it is the second transistor group that is larger in maximum value of antenna ratio than the first transistor group. This is based on the fact that the resistance to the chargeup damage of a gate insulation film becomes higher with a decrease in thickness of the gate insulation film while letting a prespecified value of 6.0 nm or less be as a boundary. In this way, in the semiconductor device embodying the invention, the maximum value of antenna ratio is made relatively large in the second transistor group which is relatively less in gate insulation film thickness. Consequently in the second transistor group, the constraint to an upper limit value of the area (length) of wire becomes more loosened so that the degree of freedom of the wiring layout is enhanced.

What is claimed is:

1. A semiconductor device including [a] field effect [transistor] *transistors* having a gate electrode with a wire connected thereto and a gate insulation film with a thickness less than or equal to 6.0 nm, said device comprising:

a first transistor group made up of a plurality of said field effect transistors being the same in thickness of said gate insulation film;

a second transistor group made up of a plurality of said field effect transistors being the same in thickness of said gate insulation film, wherein the thickness of said gate insulation film is less than the thickness of said gate insulation film of said first transistor group; and a semiconductor substrate with the first and second transistor groups being mounted thereon in a mixed manner, wherein an antenna ratio which is a ratio of an area of said wire to a gate area of said gate electrode is such that a maximal value of said second transistor group is made larger than a maximal value of said first transistor group.

2. The semiconductor device according to claim 1, wherein said antenna ratio is such that the maximal value of said second transistor group is made larger by at least one order of magnitude than the maximal value of said first transistor group.

3. The semiconductor device according to claim 1, wherein said wire is a multilayered wire, and that the area of said wire is a total area equivalent to a sum of areas of respective layers of said multilayered wire.

4. The semiconductor device according to claim 3, wherein said gate electrode and said semiconductor substrate are conducted by the n-th layer (n is an integer more than or equal to 2) of said multilayered wire, and wherein at a stage of formation of said multilayered wire up to its (n-1)th layer, the area of said wire is a total area equivalent to a sum of areas of portions of respective layers up to said (n−1)th layer of said multilayered wire, which portions are conducted to said gate electrode.

5. The semiconductor device according to claim 3, wherein the area of said wire is a total area equivalent to a sum of areas of exposed portions of respective layers of said multilayered wire in a state that the portions are conducted to said gate electrode in a fabrication process of said semiconductor device.

6. The semiconductor device according to claim 3, wherein each layer of said multilayered wire is connected by a plug, and the area of said wire includes an area of said plug.

7. The semiconductor device according to claim 1, wherein the area of said wire is a total area equivalent to a sum of areas of both side surfaces and an upper surface of said wire.

8. The semiconductor device according to claim 1, wherein the area of said wire is an area of an upper surface of said wire.

9. The semiconductor device according to claim 8, wherein the area of said wire is the area of said upper surface×2.

10. The semiconductor device according to claim 1, wherein an interlayer dielectric film formed above said wire includes a low dielectric constant film.

11. The semiconductor device according to claim 1, wherein a functional block comprised of said first transistor group is different in function from a functional block made up of said second transistor group.

12. The semiconductor device according to claim 11, wherein said gate insulation films of said first and second transistor groups include a silicon oxide film together, said functional block comprised of said first transistor group is at least one of a memory, an I/O circuit, a power supply circuit, an analog filter circuit and a direct current operating circuit, and said functional block made up of said second transistor group is a logic circuit.

13. The semiconductor device according to claim 12, wherein said memory includes a NAND type EEPROM.

14. The semiconductor device according to claim 11, wherein said gate insulation film of said first transistor group includes a high dielectric film, said gate insulation film of said second transistor group includes a silicon oxide film, said functional block comprised of said first transistor group is a logic circuit, and said functional block comprised of said second transistor group is at least one of a memory, an I/O circuit, a power supply circuit, an analog filter circuit and a direct current operating circuit.

15. A design method of the semiconductor device as recited in claim 1, said method comprising:

displaying said first and second transistor groups on a screen; and automatically wiring on said screen while letting said wire of said first transistor group be such that a first antenna ratio is an allowable value and while letting said wire of said second transistor group be such that a second antenna ratio greater than said first antenna ratio is an allowable value.

*16. A semiconductor device having gate insulator films less than 6 nm, comprising:*

*a first circuit having first transistors with first wirings respectively connected to first gates of said first transistors; and*

*a second circuit having second transistors with second wirings respectively connected to second gates of said second transistors; and*

*said first circuit having a first antenna ratio different than a second antenna ratio of said second circuit,*

*wherein a thickness of a gate insulator film in said second transistors is thinner than a thickness of a gate insulator film in said first transistors,*

*wherein said first and second antenna ratios are such that the maximal value of said second antenna ratio of said second circuit is more than three times larger than the maximal value of said first antenna ratio of said first circuit.*

*17. The semiconductor device according to claim 16, comprising:*

*said second transistors having a gate insulator film; and*

*said first transistors having a high-dielectric constant gate insulator film.*

*18. The semiconductor device according to claim 17, wherein said high-dielectric constant gate insulator film comprises one of hafnium oxide, hafnium silicate, zirconium oxide and zirconium silicate.*

*19. The semiconductor device according to claim 16, wherein:*

*a thickness of a gate insulator film in said first transistors is more than twice as thick as a thickness of a gate insulator film in said second transistors.*

*20. The semiconductor device according to claim 16, wherein:*

*a thickness of said gate insulator film in said first transistors is about 5 nm, and*

*a thickness of said gate insulator film in said second transistors is about 2.5 nm.*

*21. The semiconductor device according to claim 16, comprising:*

*the maximal value of said second antenna ratio being more than six times greater than the maximal value of said first antenna ratio.*

*22. The semiconductor device according to claim 21, comprising:*

*said first transistors having a gate insulator film thickness more than twice as thick as a gate insulator film thickness in said second transistors.*

*23. The semiconductor device according to claim 16, comprising:*

*an interlayer dielectric film having a low dielectric constant material on at least one of said first transistors and said second transistors.*

*24. The semiconductor device according to claim 23, wherein said low dielectric constant material comprises one of SiOC, SiOCH, SiOCN, SiO2, SiN and an aromatic series-based organic film.*

*25. The semiconductor device according to claim 16, comprising:*

*said first wirings having a maximum allowable length shorter than a maximum allowable length of said second wirings.*

*26. The semiconductor device according to claim 16, wherein said first and second antenna ratios uses a sum of areas of exposed wires in a state that said exposed wires are conducted with a gate electrode in one of said first and second transistors during a manufacturing process of said device that generates charged particles.*

*27. The semiconductor device according to claim 26, comprising:*

*determining said antenna ratio using a sum of top and side areas of said exposed wires.*

*28. The semiconductor device according to claim 26, comprising:*

*determining said antenna ratio using a sum of top areas of said exposed wires.*

*29. The semiconductor device according to claim 26, wherein said sum of areas of exposed wires is defined as (wire width+2*1.3r)*total wire length, wherein said r is a thickness of a dielectric film deposited on said exposed wires.*

*30. The semiconductor device according to claim 29, wherein said exposed wires are formed by damascene.*

*31. The semiconductor device according to claim 16, wherein said first circuit is different in function from said second circuit.*

*32. The semiconductor device according to claim 16, wherein said first circuit is at least one of a memory, an I/O circuit, a power supply circuit, an analog filter circuit, and a direct current operating circuit, and said second circuit is a logic circuit.*

*33. The semiconductor device according to claim 16, wherein the maximal value of said second antenna ratio is made larger by at least one order of magnitude than the maximal value of said first antenna ratio.*

*34. The semiconductor device according to claim 33, comprising:*

*said second transistors having a gate insulator film; and*

*said first transistors having a high-dielectric constant gate insulator film.*

*35. The semiconductor device according to claim 34, wherein said high-dielectric constant gate insulator film comprises one of hafnium oxide, hafnium silicate, zirconium oxide and zirconium silicate.*

*36. The semiconductor device according to claim 33, wherein:*

*a thickness of said gate insulator film in said first transistors is about 5 nm, and*

*a thickness of said gate insulator film in said second transistors is about 2.5 nm.*

*37. The semiconductor device according to claim 33, wherein said first and second antenna ratios uses a sum of areas of exposed wires in a state that said exposed wires are conducted with a gate electrode in one of said first and second transistors during a manufacturing process of said device that generates charged particles.*

*38. The semiconductor device according to claim 37, comprising:*

*determining said antenna ratio using a sum of top and side areas of said exposed wires.*

*39. The semiconductor device according to claim 37, comprising:*

*determining said antenna ratio using a sum of top areas of said exposed wires.*

*40. The semiconductor device according to claim 37, wherein said sum of areas of exposed wires is defined as (wire width+2*1.3r)*total wire length, wherein said r is a thickness of a dielectric film deposited on said exposed wires.*

*41. The semiconductor device according to claim 16, comprising:*

*a third circuit having third transistors with third wirings respectively connected to third gates of said third transistors, said third circuit having a third antenna ratio different than the first antenna ratio and different than the second antenna ratio,*

*wherein a thickness of a gate insulator film in said third transistors is thinner than a thickness of a gate insulator film in said second transistors, and*

*wherein the maximal value of said third antenna ratio of said third circuit is larger than the maximal value of said second antenna ratio of said second circuit.*

*42. The semiconductor device according to claim 41, wherein:*

*a thickness of a gate insulator film in said first transistors is more than twice as thick as a thickness of a gate insulator film in said second transistors; and*

*a thickness of a gate insulator film in said second transistors is more than twice as thick as a thickness of a gate insulator film in said third transistors.*

*43. The semiconductor device according to claim 41, wherein:*

*a thickness of said gate insulator film in said first transistors is about 5 nm;*

*a thickness of said gate insulator film in said second transistors is about 2.5 nm; and*

*a thickness of said gate insulator film in said third transistors is about 1 nm.*

*44. The semiconductor device according to claim 41, wherein;*

*the maximal value of said second antenna ratio is made larger by at least one order of magnitude than the maximal value of said first antenna ratio; and*

*the maximal value of said third antenna ratio is made larger by at least one order of magnitude than the maximal value of said second antenna ratio.*

*45. The semiconductor device according to claim 44, wherein:*

*a thickness of a gate insulator film in said first transistors is more than twice as thick as a thickness of a gate insulator film in said second transistors; and*

*a thickness of a gate insulator film in said second transistors is more than twice as thick as a thickness of a gate insulator film in said third transistors.*

* * * * *